(12) United States Patent
Lai et al.

(10) Patent No.: US 6,624,775 B1
(45) Date of Patent: Sep. 23, 2003

(54) CURRENT OUTPUT CIRCUIT FOR USE IN DIGITAL-TO-ANALOG CONVERTER

(75) Inventors: Sheng-Yeh Lai, Tai-Chung (TW); Hung-Chih Liu, Hsinchu (TW)

(73) Assignee: Silicon Integrated System Corp., Taiwan (CN)

( * ) Notice: Subject to any disclaimer, the term of this patent is extended or adjusted under 35 U.S.C. 154(b) by 0 days.

(21) Appl. No.: 10/175,898

(22) Filed: Jun. 21, 2002

(51) Int. Cl.[7] .............................................. H03M 1/66
(52) U.S. Cl. ...................................... 341/144; 341/136
(58) Field of Search ................................ 341/144, 136, 341/150; 330/277

(56) References Cited

U.S. PATENT DOCUMENTS 6,218,871 B1 * 4/2001 Chiou ........................ 341/136
6,545,619 B1 * 4/2003 Segura ....................... 341/144

* cited by examiner

Primary Examiner—Brian Young
(74) Attorney, Agent, or Firm—Lowe Hauptman Gilman & Berner, LLP

(57) ABSTRACT

A current output circuit for use in a digital-to-analog converter is disclosed. The current output circuit includes a current source for providing a driving current, and a first output circuit coupled with the current source. The first output circuit includes a first metal-oxide semiconductor (MOS) transistor device having a source electrode thereof connected to the current source in series, a first voltage amplifier coupled between the source electrode and a gate electrode of the first MOS transistor device for keeping a voltage of the source electrode substantially constant, and a first controlled switch coupled between an operational voltage and the gate electrode of the first MOS transistor device for being switched ON or OFF in response to a first digital control signal, and allowing the driving current to be outputted from a drain electrode of the MOS transistor device when the first controlled switch is switched ON.

13 Claims, 3 Drawing Sheets

CURRENT OUTPUT CIRCUIT FOR USE IN DIGITAL-TO-ANALOG CONVERTER

FIELD OF THE INVENTION

The present invention relates to a current output circuit, and more particularly to a current output circuit for use in a digital-to-analog converter.

BACKGROUND OF THE INVENTION

Along with technological development, the request for high quality signal transmission progressively increases. Hence, how to design a digital-to-analog converter with high accuracy becomes an important issue.

Please refer to FIG. 1A which is a schematic circuit block diagram illustrating a conventional current-type digital-to-analog converter. The current-type digital-to-analog converter includes an encoder 10 and a current output circuit 11 including plural current output cells 111. When digital signal data[0:N] are inputted into the digital-to-analog converter, the digital signal data[0:N] are encoded into switch control signals via the encoder 10. The switch control signals control respective switches of the current output cells 111 to output analog voltages equivalent to the digital signal data.

Please refer to FIG. 1B which is a schematic circuit diagram illustrating one of the current output cells of FIG. 1A. PMOS transistor MP1 is considered as a constant current source under a bias VB1, and the current output path is determined by control signals C and CB wherein the signal CB has a reverse phase compared to the phase of the signal C.

As known, the design of the current output cell in the digital-to-analog converter will affect the linearity of output current. For example, the current output linearity of the current output cell can be increased by serially connecting thereto a transistor under a common voltage to enhance output impedance. The above way is generally feasible under a high operational voltage. However, with the increasing demand of reduced operational voltage, it is difficult to increase the output impedance and thus the current output linearity in the above-mentioned way.

Therefore, the purpose of the present invention is to develop a current output circuit for use in a digital-to-analog converter to deal with the above situations encountered in the prior art.

SUMMARY OF THE INVENTION

An object of the present invention is to provide a current output circuit for use in a digital-to-analog converter, which has a satisfying output impedance and current output linearity under a relatively small operational voltage.

According to an aspect of the present invention, there is provided a current output circuit for use in a digital-to-analog converter. The current output circuit includes a current source for providing a driving current, and a first output circuit coupled with the current source. The first output circuit includes a first metal-oxide semiconductor (MOS) transistor device having a source electrode thereof connected to the current source in series, a first voltage amplifier coupled between the source electrode and a gate electrode of the first MOS transistor device for keeping a voltage of the source electrode substantially constant, and a first controlled switch coupled between an operational voltage and the gate electrode of the first MOS transistor device for being switched ON or OFF in response to a first digital control signal, and allowing the driving current to be outputted from a drain electrode of the MOS transistor device when the first controlled switch is switched ON.

Preferably, the first digital control signal is generated by encoding a digital signal via an encoder.

For example, the first MOS transistor device can be a P-channel MOS transistor device.

Preferably, the current output circuit further includes a second output circuit. The second output circuit coupled with the current source includes a second metal-oxide semiconductor (MOS) transistor device having a source electrode thereof connected to the current source in series, a second voltage amplifier coupled between the source electrode and a gate electrode of the second MOS transistor device for keeping a voltage of the source electrode substantially constant, and a second controlled switch coupled between an operational voltage and the gate electrode of the second MOS transistor device for being switched ON or OFF in response to a second digital control signal, and allowing the driving current to be outputted from a drain electrode of the MOS transistor device when the second controlled switch is switched ON. The second digital control signal is preferably generated by encoding a digital signal via an encoder. For example, the second MOS transistor device can be a P-channel MOS transistor device.

Preferably, the first digital control signal received by the first output circuit has a reverse phase compared to a phase of the second digital control signal received by the second output circuit.

According to another aspect of the present invention, there is provided a current output circuit for use in a digital-to-analog converter. The current output circuit includes a current source for providing a driving current, a first output circuit and a second output circuit. Both first and second output circuit are coupled with the current source. The first output circuit includes a first metal-oxide semiconductor (MOS) transistor device having a source electrode thereof connected to the current source in series, a first voltage amplifier coupled between the source electrode and a gate electrode of the first MOS transistor device for keeping a voltage of the source electrode substantially constant, and a first controlled switch coupled between an operational voltage and the gate electrode of the first MOS transistor device for being switched ON or OFF in response to a first digital control signal, and allowing the driving current to be outputted from a drain electrode of the MOS transistor device when the first controlled switch is switched ON. The second output circuit includes a second metal-oxide semiconductor (MOS) transistor device having a source electrode thereof connected to the current source in series, a second voltage amplifier coupled between the source electrode and a gate electrode of the second MOS transistor device for keeping a voltage of the source electrode substantially constant, and a second controlled switch coupled between an operational voltage and the gate electrode of the second MOS transistor device for being switched ON or OFF in response to a second digital control signal, and allowing the driving current to be outputted from a drain electrode of the MOS transistor device when the second controlled switch is switched ON. The first digital control signal received by the first output circuit has a reverse phase compared to a phase of the second digital control signal received by the second output circuit.

According to a further aspect of the present invention, there is provided a current output circuit for use in a digital-to-analog converter. The current output circuit includes a current source for providing a driving current, and at least one output circuit coupled with the current source. The at least one output circuit includes a metal-oxide semiconductor (MOS) transistor device having a source electrode thereof connected to the current source in series, a voltage amplifier coupled between the source electrode and a gate electrode of the MOS transistor device for keeping a voltage of the source electrode substantially constant, and a controlled switch coupled between an operational voltage and the gate electrode of the MOS transistor device for being switched ON or OFF in response to a digital control signal, and allowing the driving current to be outputted from a drain electrode of the MOS transistor device when the controlled switch is switched ON.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
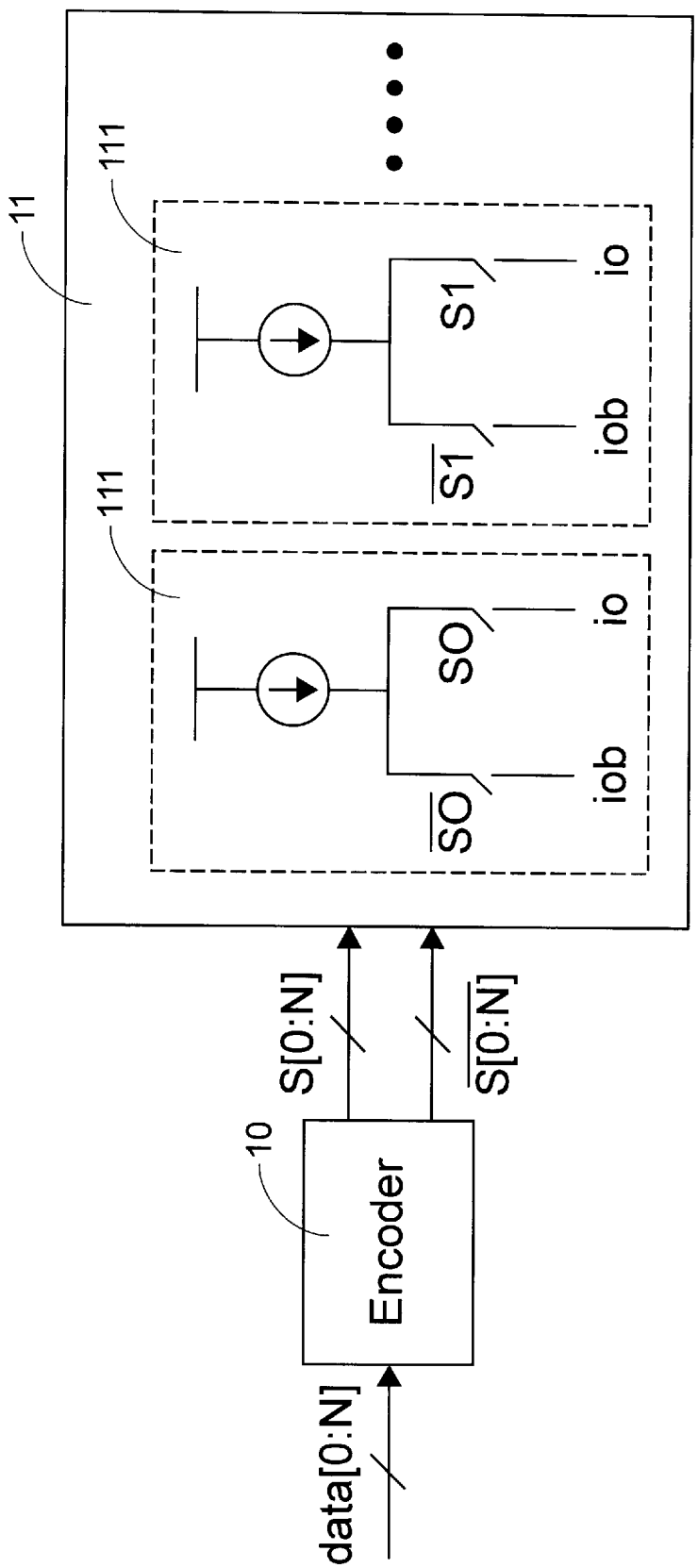
FIG. 1A is a schematic circuit block diagram illustrating a conventional current-type digital-to-analog converter.
Figure 1B:
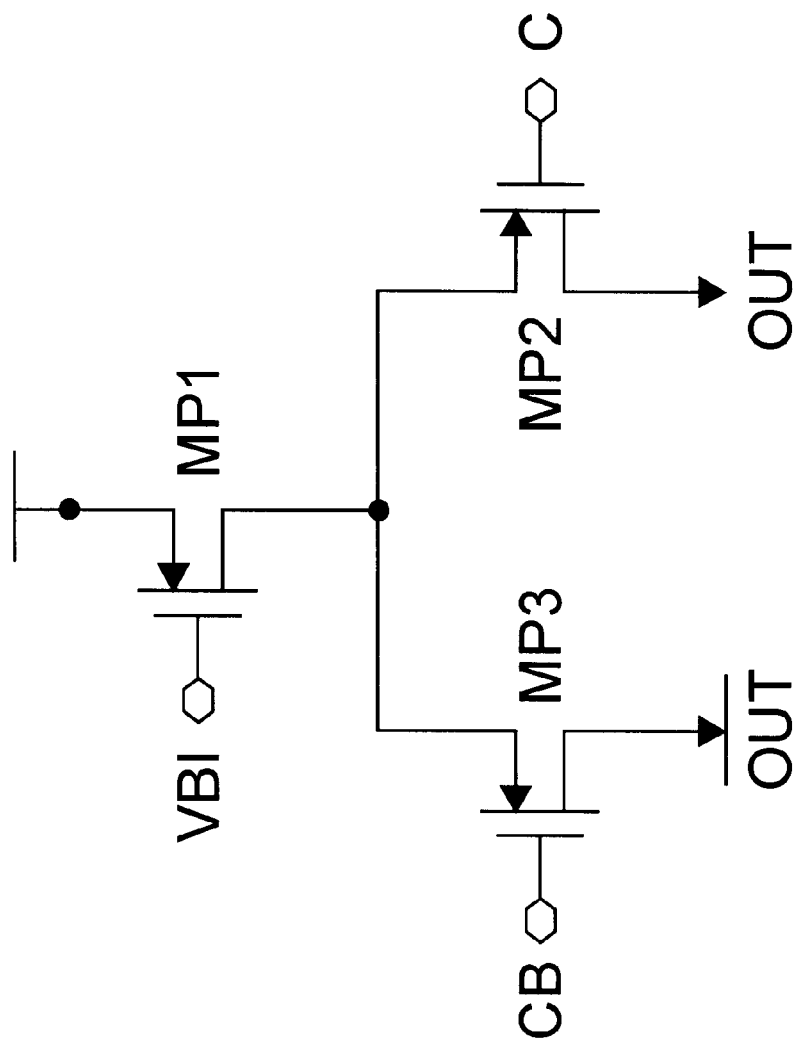
FIG. 1B is a schematic circuit diagram illustrating one of the current output cells of FIG. 1A.
Figure 2:
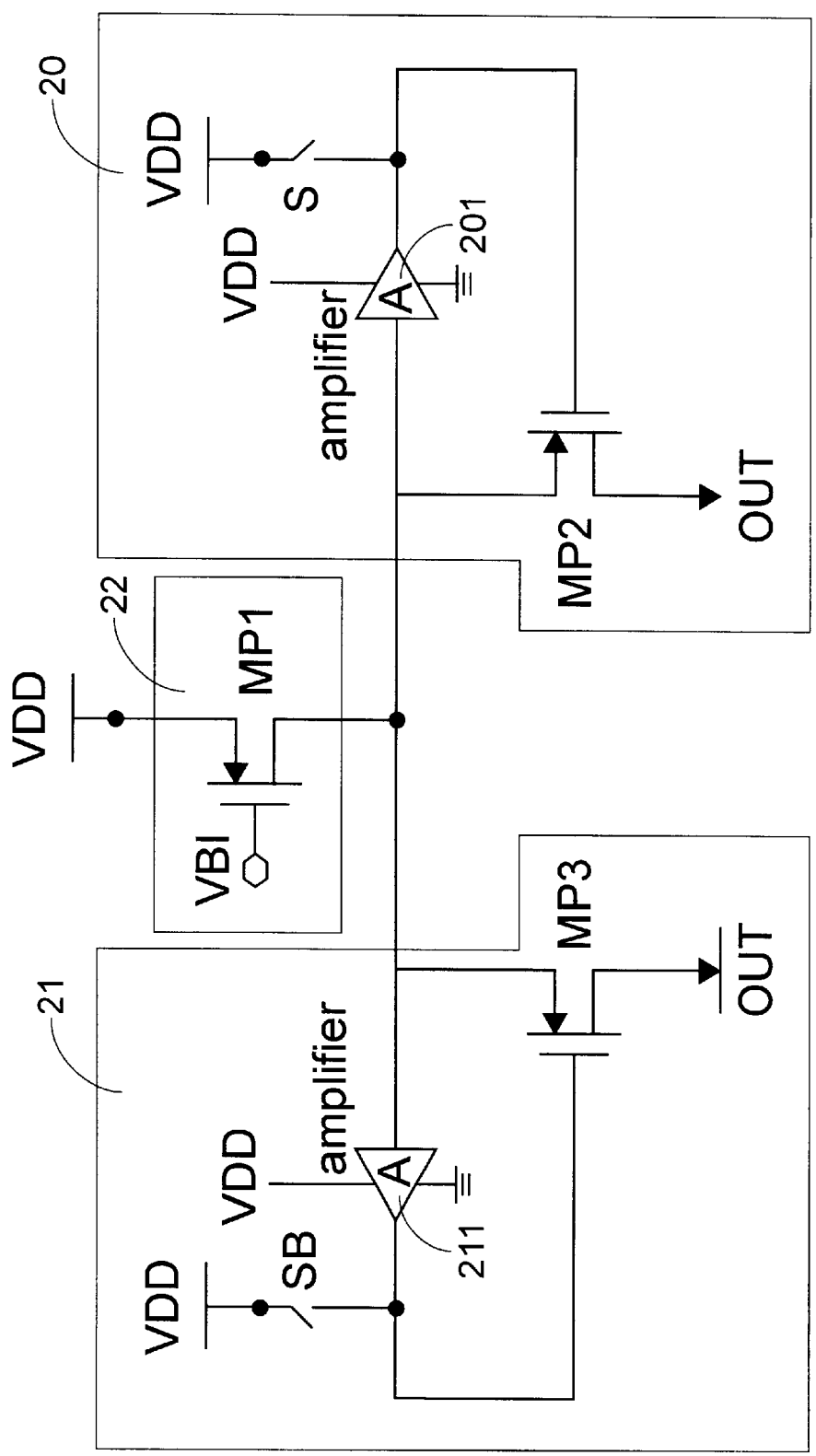
FIG. 2 is a schematic circuit block diagram illustrating a preferred embodiment of a current output circuit according to the present invention.

Please refer to FIG. 2 which is a schematic circuit diagram illustrating a preferred embodiment of a current output circuit according to the present invention. The current output circuit for use in a digital-to-analog converter is operated under an operational voltage VDD to receive digital control signals, which are generated by encoding digital input signals via an encoder of the digital-to-analog converter. The current output circuit includes a first output circuit 20, a second output circuit 21 and a current source 22. The current source 22 consists of a P-channel metal-oxide semiconductor (PMOS) transistor MP1, which outputs a driving current from the drain electrode thereof under a bias VB1.

Moreover, the first output circuit 20 coupled with the drain electrode of the PMOS transistor MP1 includes a PMOS transistor MP2, a voltage amplifier 201 and a controlled switch S as shown in FIG. 2. The source electrode of the PMOS transistor MP2 is connected to the drain electrode of the PMOS transistor MP1 in series. The voltage amplifier 201 is connected between the source electrode and the gate electrode of the PMOS transistor MP2 for keeping a voltage of the source electrode substantially constant and enhancing the output impedance of the output circuit 20. Thus, the output variation of the driving current resulting from the barying voltage of the drain electrode of the transistor MP2 can be reduced, and the current output linearity can thus be increased.

Regarding to the controlled switch S, it is coupled between the operational voltage VDD and the gate electrode of the PMOS transistor MP2. The controlled switch S is controlled by a first digital control signal to be switched ON or OFF. When the controlled switch S is switched ON, the driving current is outputted from the drain electrode of the PMOS transistor MP2.

The second output circuit 21 coupled with the drain electrode of the PMOS transistor MP1 includes a PMOS transistor MP3, a voltage amplifier 211 and a controlled switch SB as shown in FIG. 2. The structure and function of the above devices of the second output circuit 21 are similar to those of the first output circuit 20, so it would not be redundantly described herein. However, the controlled switch SB is switched ON or OFF in response to a second digital control signal has a reverse phase compared to the phase of the first digital control signal. Thus, when one of the controlled switches S and SB is switched ON in response to the first and second digital control signals, respectively, it is determined that the driving current is outputted by the corresponding one of the first output circuit 20 and the second output circuit 21. For example, when the controlled switch SB is switched OFF, and the controlled switch S is switched ON in response to the digital control signals, the driving current will be outputted from the first output circuit 20. At this moment, the voltage amplifier 201 will keep the voltage of the source electrode of the PMOS transistor MP2 in a consistency so as to increase the output impedance. The output impedance Rout can be represented by the following equation:

$$Rout = gm2 \times rds1 \times rds2 \times A1,$$

wherein gm2 is the transconductance coefficient of the PMOS transistor MP2, A1 is the gain coefficient of the voltage amplifier 201, rds1 is the channel resistance of the PMOS transistor MP1, and rds2 is the channel resistance of the PMOS transistor MP2.

Similarly, when the controlled switch S is switched OFF and the controlled switch SB is switched ON, the driving current will be outputted from the second output circuit 21. At the moment, the voltage of the source electrode of the PMOS transistor MP3 is maintained in a consistency by the voltage amplifier 211, and the output impedance is thus increased. The output impedance Rout in this case is represented by the following equation:

$$Rout = gm3 \times rds1 \times rds3 \times A2,$$

wherein gm3 is the transconductance coefficient of the PMOS transistor MP3, A2 is the gain coefficient of the voltage amplifier 211, rds1 is the channel resistance of the PMOS transistor MP1, and rds3 is the channel resistance of the PMOS transistor MP3.

To sum up, the current output circuit according to the present invention can enhance the output impedance, reduce the output variation of the driving current resulting from the inconsistent voltage of the drain electrode of the transistor MP2 or MP3, and increase the current output linearity of the digital-to-analog converter.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A current output circuit for use in a digital-to-analog converter, comprising:

a current source for providing a driving current; and a first output circuit coupled with said current source, and including:
- a first metal-oxide semiconductor (MOS) transistor device having a source electrode thereof connected to said current source in series;
- a first voltage amplifier coupled between said source electrode and a gate electrode of said first MOS transistor device for keeping a voltage of the source electrode substantially constant; and
- a first controlled switch coupled between an operational voltage and said gate electrode of said first MOS transistor device for being switched ON or OFF in response to a first digital control signal, and allowing said driving current to be outputted from a drain electrode of said MOS transistor device when said first controlled switch is switched ON.

2. The current output circuit according to claim 1 wherein said first digital control signal is generated by encoding a digital signal via an encoder.

3. The current output circuit according to claim 1 wherein said first MOS transistor device is a P-channel MOS transistor device.

4. The current output circuit according to claim 1 further comprising a second output circuit, which includes:
- a second metal-oxide semiconductor (MOS) transistor device having a source electrode thereof connected to said current source in series;
- a second voltage amplifier coupled between said source electrode and a gate electrode of said second MOS transistor device for keeping a voltage of the source electrode substantially constant; and
- a second controlled switch coupled between an operational voltage and said gate electrode of said second MOS transistor device for being switched ON or OFF in response to a second digital control signal, and allowing said driving current to be outputted from a drain electrode of said MOS transistor device when said second controlled switch is switched ON.

5. The current output circuit according to claim 4 wherein said wherein said second digital control signal is generated by encoding a digital signal via an encoder.

6. The current output circuit according to claim 4 wherein said second MOS transistor device is a P-channel MOS transistor device.

7. The current output circuit according to claim 4 wherein said first digital control signal received by said first output circuit has a reverse phase compared to a phase of said second digital control signal received by said second output circuit.

8. A current output circuit for use in a digital-to-analog converter, comprising:
- a current source for providing a driving current;
- a first output circuit coupled with said current source, and including:
  - a first metal-oxide semiconductor (MOS) transistor device having a source electrode thereof connected to said current source in series;
  - a first voltage amplifier coupled between said source electrode and a gate electrode of said first MOS transistor device for keeping a voltage of the source electrode substantially constant; and
  - a first controlled switch coupled between an operational voltage and said gate electrode of said first MOS transistor device for being switched ON or OFF in response to a first digital control signal, and allowing said driving current to be outputted from a drain electrode of said MOS transistor device when said first controlled switch is switched ON; and
- a second output circuit coupled with said current source, and including:
  - a second metal-oxide semiconductor (MOS) transistor device having a source electrode thereof connected to said current source in series;
  - a second voltage amplifier coupled between said source electrode and a gate electrode of said second MOS transistor device for keeping a voltage of the source electrode substantially constant; and
  - a second controlled switch coupled between an operational voltage and said gate electrode of said second MOS transistor device for being switched ON or OFF in response to a second digital control signal, and allowing said driving current to be outputted from a drain electrode of said MOS transistor device when said second controlled switch is switched ON,
- wherein said first digital control signal received by said first output circuit has a reverse phase compared to a phase of said second digital control signal received by said second output circuit.

9. The current output circuit according to claim 8 wherein said wherein said first and said second digital control signals are generated by encoding digital signals via an encoder.

10. The current output circuit according to claim 9 wherein said first and said second MOS transistor devices are P-channel MOS transistor devices.

11. A current output circuit for use in a digital-to-analog converter, comprising:
- a current source for providing a driving current; and
- at least one output circuit coupled with said current source, and including:
  - a metal-oxide semiconductor (MOS) transistor device having a source electrode thereof connected to said current source in series;
  - a voltage amplifier coupled between said source electrode and a gate electrode of said MOS transistor device for keeping a voltage of the source electrode substantially constant; and
  - a controlled switch coupled between an operational voltage and said gate electrode of said MOS transistor device for being switched ON or OFF in response to a digital control signal, and allowing said driving current to be outputted from a drain electrode of said MOS transistor device when said controlled switch is switched ON.

12. The current output circuit according to claim 11 wherein said wherein said digital control signal is generated by encoding a digital signal via an encoder.

13. The current output circuit according to claim 11 wherein said MOS transistor device is a P-channel MOS transistor device.

* * * * *